United States Patent
Yazdi et al.

(10) Patent No.: US 8,847,337 B2
(45) Date of Patent: Sep. 30, 2014

(54) PROCESSES AND MOUNTING FIXTURES FOR FABRICATING ELECTROMECHANICAL DEVICES AND DEVICES FORMED THEREWITH

(75) Inventors: Navid Yazdi, Ann Arbor, MI (US); Yafan Zhang, Troy, MI (US); Weibin Zhu, Ann Arbor, MI (US)

(73) Assignee: Evigia Systems, Inc., Ann Arbor, MI (US)

( * ) Notice: Subject to any disclaimer, the term of this patent is extended or adjusted under 35 U.S.C. 154(b) by 0 days.

(21) Appl. No.: 13/404,056

(22) Filed: Feb. 24, 2012

(65) Prior Publication Data

US 2012/0286380 A1 Nov. 15, 2012

Related U.S. Application Data

(60) Provisional application No. 61/457,319, filed on Feb. 25, 2011.

(51) Int. Cl.
*H01L 29/84* (2006.01)
*H01L 21/02* (2006.01)

(52) U.S. Cl.
USPC ............................................. 257/415; 438/51

(58) Field of Classification Search
USPC ....................................................... 257/415
See application file for complete search history.

(56) References Cited

U.S. PATENT DOCUMENTS

| 8,368,154 B2* | 2/2013 | Trusov et al. ................. 257/417 |
| 2010/0087024 A1* | 4/2010 | Hawat et al. .................... 438/51 |
| 2012/0032286 A1 | 2/2012 | Trusov et al. | |

OTHER PUBLICATIONS

Elliot E. Hui, Roger T. Howe, and M. Steven Rodgers, "Single-Step Assembly of Complex 3-D Microstructrures".
Montgomery C. Riers, Alexander A. Trusov, Sergei A. Zotov, Andrei M. Shkel, Micro IMU Utilizing Folded Cube Approach, IMAPS 6th International Conference and Exhibition on Device Packaging, Scottsdale, AZ, Mar. 8-11, 2010.
Sergei A. Zotov, Montgomery C. Rivers, Alexander A. Trusov, Andrei M. Shkel, Chip-Scale IMU Using Folded-MEMS Approach, IEEE Sensors 2010 Conference, pp. 1043-1046.

* cited by examiner

*Primary Examiner* — Zandra Smith
*Assistant Examiner* — Damian A Hillman
(74) *Attorney, Agent, or Firm* — Hartman Global IP Law; Gary M. Hartman; Michael D. Winter

(57) ABSTRACT

Processes and fixtures for producing electromechanical devices, and particularly three-dimensional electromechanical devices such as inertial measurement units (IMUs), through the use of a fabrication process and a three-dimensional assembly process that entail joining single-axis device-IC chips while positioned within a mounting fixture that maintains the orientations and relative positions of the chips during the joining operation.

22 Claims, 9 Drawing Sheets

PROCESSES AND MOUNTING FIXTURES FOR FABRICATING ELECTROMECHANICAL DEVICES AND DEVICES FORMED THEREWITH

CROSS REFERENCE TO RELATED APPLICATIONS

This application claims the benefit of U.S. Provisional Application No. 61/457,319, filed Feb. 25, 2011, the contents of which are incorporated herein by reference.

BACKGROUND OF THE INVENTION

The present invention generally relates to electromechanical devices, such as micro-electromechanical systems (MEMS). More particularly, this invention relates to fixtures for assembling electromechanical devices, processes for fabricating such fixtures, processes for fabricating electromechanical devices with such fixtures, and electromechanical devices that can be fabricated with the use of such fixtures.

Inertial measurement units (IMUs) are electromechanical devices adapted to measure various parameters of a moving object, for example, velocity, orientation, and gravitational forces through the use of a combination of sensors, including inertial accelerometers and gyroscopes. The output of IMUs can be used in inertial navigation systems for the purpose of maneuvering vehicles, for example, manned and unmanned aircrafts, spacecrafts, water crafts, etc. In view of these capabilities, IMUs are widely used in a variety of areas, such as the defense, exploration, and automotive industries.

Current state-of-the-art self-contained inertial navigation systems typically employ IMUs comprising discrete mechanical assemblies of discrete components, including discrete sensors (for example, accelerometers and gyroscopes) adapted to sense parameters along the axes of interest, as well as the electronics used to control and monitor the sensors and process their outputs. The resultant power consumption and unit physical volume are very limited. In addition, the accuracy of IMUs containing discrete assembled inertial measurement devices and systems degrades over time due to changes in stress and temperature of the mechanical assemblies. Consequently, advancements in the physical configurations of IMUs and the manner in which they are assembled are desirable.

BRIEF DESCRIPTION OF THE INVENTION

The present invention provides fixtures suitable for assembling electromechanical devices, including but not limited to IMUs, as well as processes for fabricating such fixtures, processes for fabricating electromechanical devices with such fixtures, and electromechanical devices that can be fabricated with the use of such fixtures. The invention is particularly well suited for achieving a high-yield process for fabricating three-axis IMUs having a three-dimensional assembly configuration, and packages in which multiple single-axis device chips are assembled and joined to produce a three-axis IMU. The invention is capable of employing all-silicon fabrication process that incorporates thermal isolation and vacuum-assisted three-dimensional assembly techniques and packaging at wafer level.

According to a first aspect of the invention, a mounting fixture is provided that includes a wafer member defining oppositely-disposed first and second surfaces, and at least one mounting cavity defining an opening in the first surface of the wafer member. The mounting cavity is defined by multiple side walls and a bottom wall that adjoins the sidewalls and closes the mounting cavity at the second surface of the wafer member. The mounting fixture further includes channels within the side walls, holes in the side walls that are fluidically coupled to the channels, and holes in the bottom walls.

According to a second aspect of the invention, a process is provided for fabricating a mounting fixture. The process includes etching a wafer member having oppositely-disposed first and second surfaces to define at least one mounting cavity that defines an opening in the first surface of the wafer member, multiple side walls and a bottom wall that adjoins the sidewalls and closes the mounting cavity at the second surface of the wafer member, channels within the side walls, holes in the side walls that are fluidically coupled to the channels, and holes in the bottom walls.

Another aspect of the invention is a three-dimensional electromechanical device that comprises first, second and third chips that are bonded together and oriented to be orthogonal to each other.

Other aspects of the invention include processes of using a mounting fixture comprising the elements described above or formed by a process as described above, as well as the resulting three-dimensional electromechanical device and uses for the resulting three-dimensional electromechanical device.

A technical effect of the invention is the ability to integrate sensing devices (for example, integrate inertial sensing devices such as gyroscopes and accelerometers), integrated circuit (IC) electronics, three-dimensional assemblies, and micro-packaging at wafer level in the fabrication of electromechanical devices, especially IMUs, that are capable of being more sensitive and stable in their performance, more compact in overall size, and consume less power as compared to conventional electromechanical devices that are assembled from discrete sensing devices and packages. IMUs fabricated in accordance with the invention are capable of use as standalone units or used in combination with global positioning systems (GPS) within buildings or any open environment.

The above-noted technical effects of the invention can be realized in part by various preferred aspects of the invention. For example, the invention is capable of being implemented as a robust high-yield fabrication process that enables sensor chips to be fabricated through the integration of all-silicon inertial sensing devices on CMOS wafers. With this aspect, single-crystal silicon structural layers can be used to form structures of high-sensitivity low-noise inertial sensors. In addition, micro flex-cable interconnections can be fabricated to interconnect individual sensor chips to enable assembly and electrical interconnection of the chips through the use of a three-dimensional folding technique.

The invention can further make use of thermal isolation to isolate temperature-sensitive sensing devices, for example, gyroscopes and CMOS integrated circuits, from the environment to promote and maintain performance, accuracy, and system stability. Thermal isolation is preferably achieved by suspending a platform supporting the sensing device(s) and associated IC with thin beams over an enclosed vacuum cavity. The cavity temperature can be controlled by heaters to maintain a constant temperature within the cavity.

Another preferred aspect of the invention is to employ a high-yield high-precision batch assembly process to produce three-dimensional IMUs (and other types of electromechanical devices) by assembling individual sensor chips. The preferred batch process uses a mounting fixture with cavities for three-dimensional mounting of the sensor chips and embedded channels that apply vacuum suction to reliably and precisely mount the sensor chips at wafer level, by which the chips can be rigidly secured within the cavities during bonding of the sensor chips.

Other aspects and advantages of this invention will be better appreciated from the following detailed description.

BRIEF DESCRIPTION OF THE DRAWINGS

FIG. 6a-b schematically represents two views showing portions of a mounting fixture produced by processing and assembling wafers together that define multiple mount cavities in the mounting fixture, in which FIG. 6a is a perspective view showing a single cavity of the mounting fixture and FIG. 6b is a cross-sectional view showing two cavities of the mounting fixture.

DETAILED DESCRIPTION OF THE INVENTION

Figure 1:
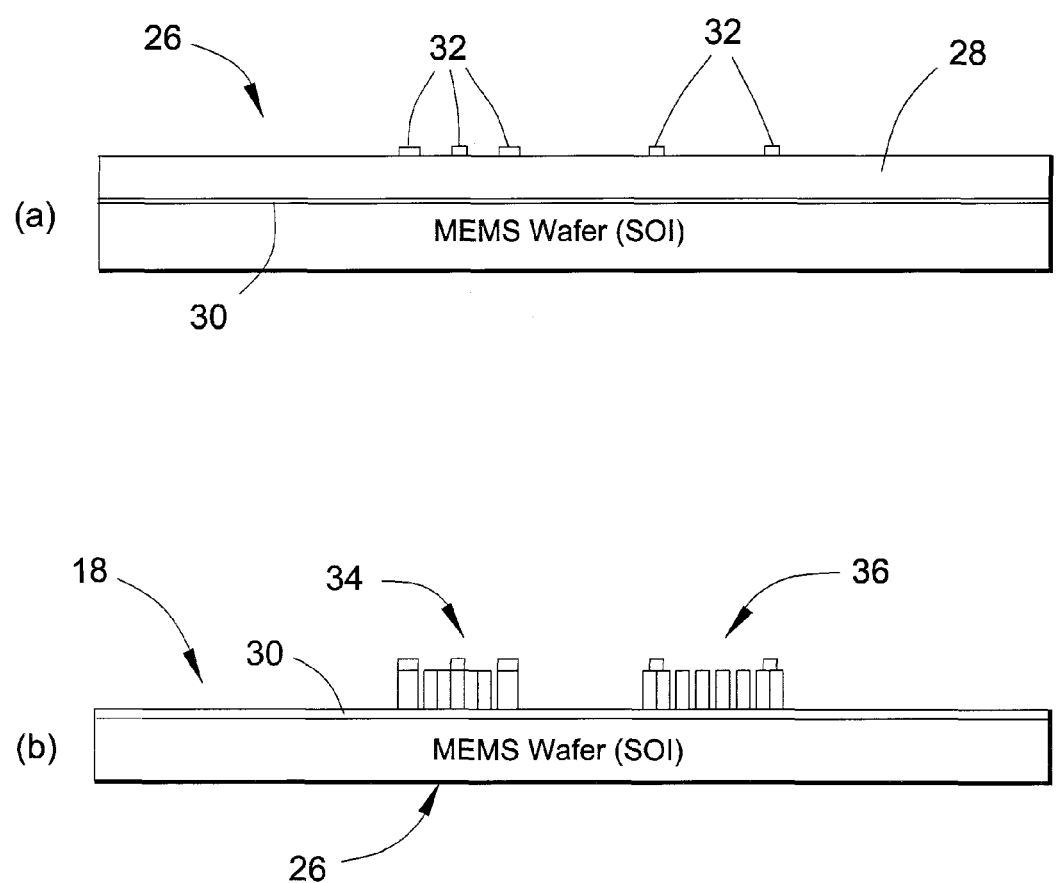
FIG. 1a-b schematically represents two steps of a fabrication process for producing a MEMS device wafer.
Figure 2:
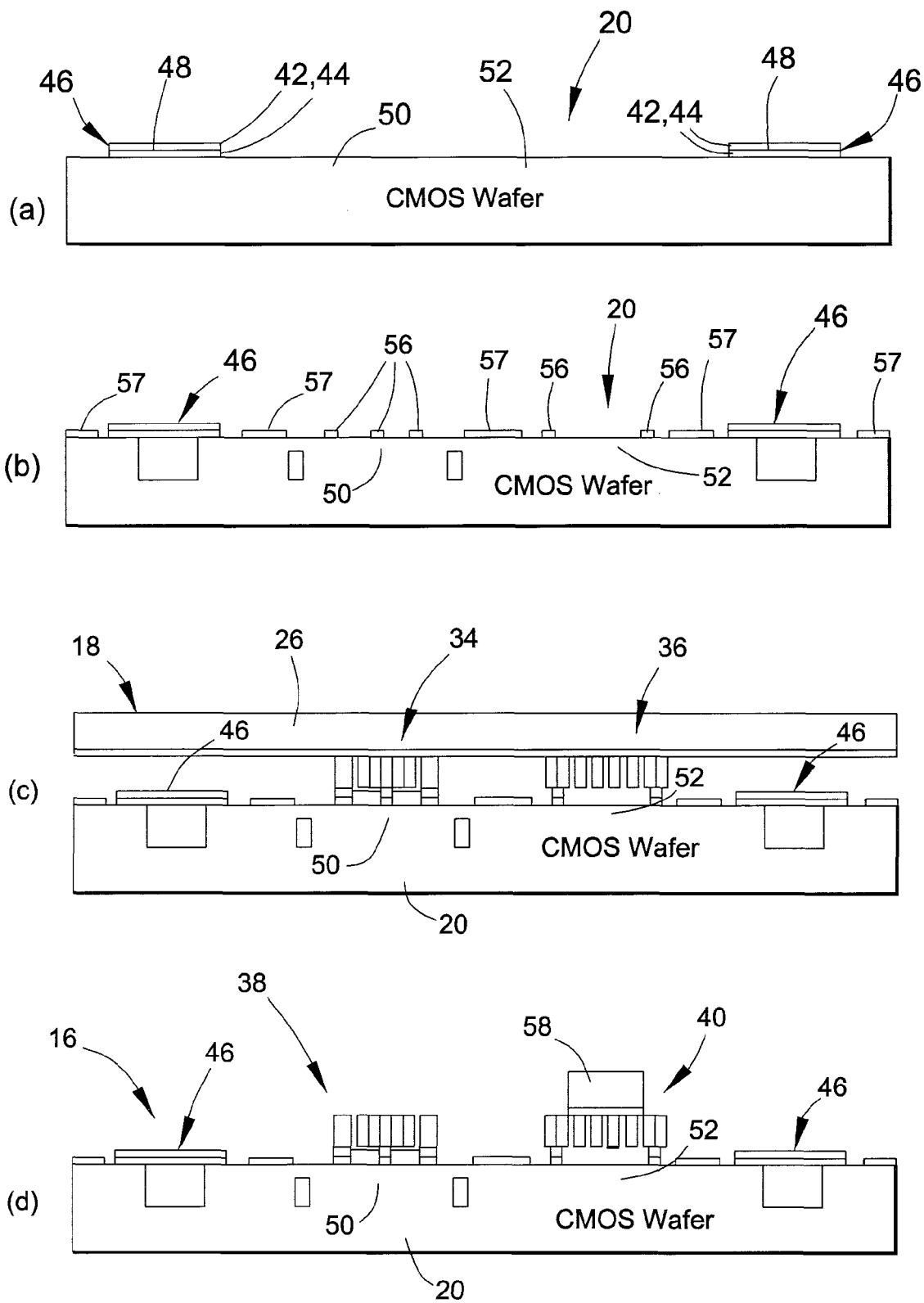
FIG. 2a-d schematically represents steps performed on a CMOS wafer to fabricate a micro flex-cable (FIGS. 2a and 2b), and then integrating the device wafer of FIG. 1 and the CMOS wafer at wafer level (FIG. 2c) to produce a device-IC wafer (FIG. 2d).
Figure 3:
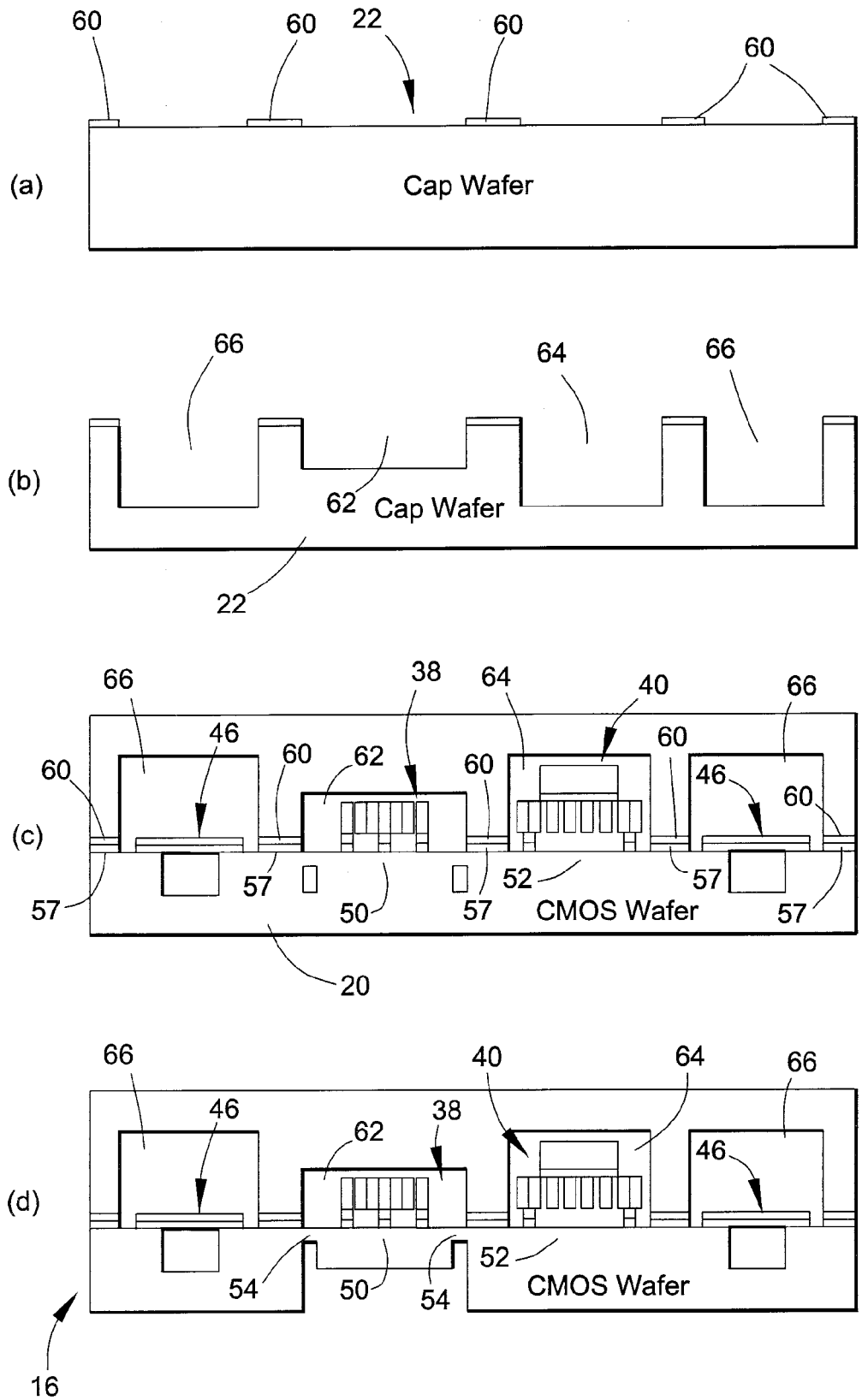
FIG. 3a-d schematically represents steps performed in the fabrication of a cap wafer (FIGS. 3a and 3b) followed by bonding with the device-IC wafer (FIG. 3c) to yield a capped device-IC wafer assembly (FIG. 3d).
Figure 4:
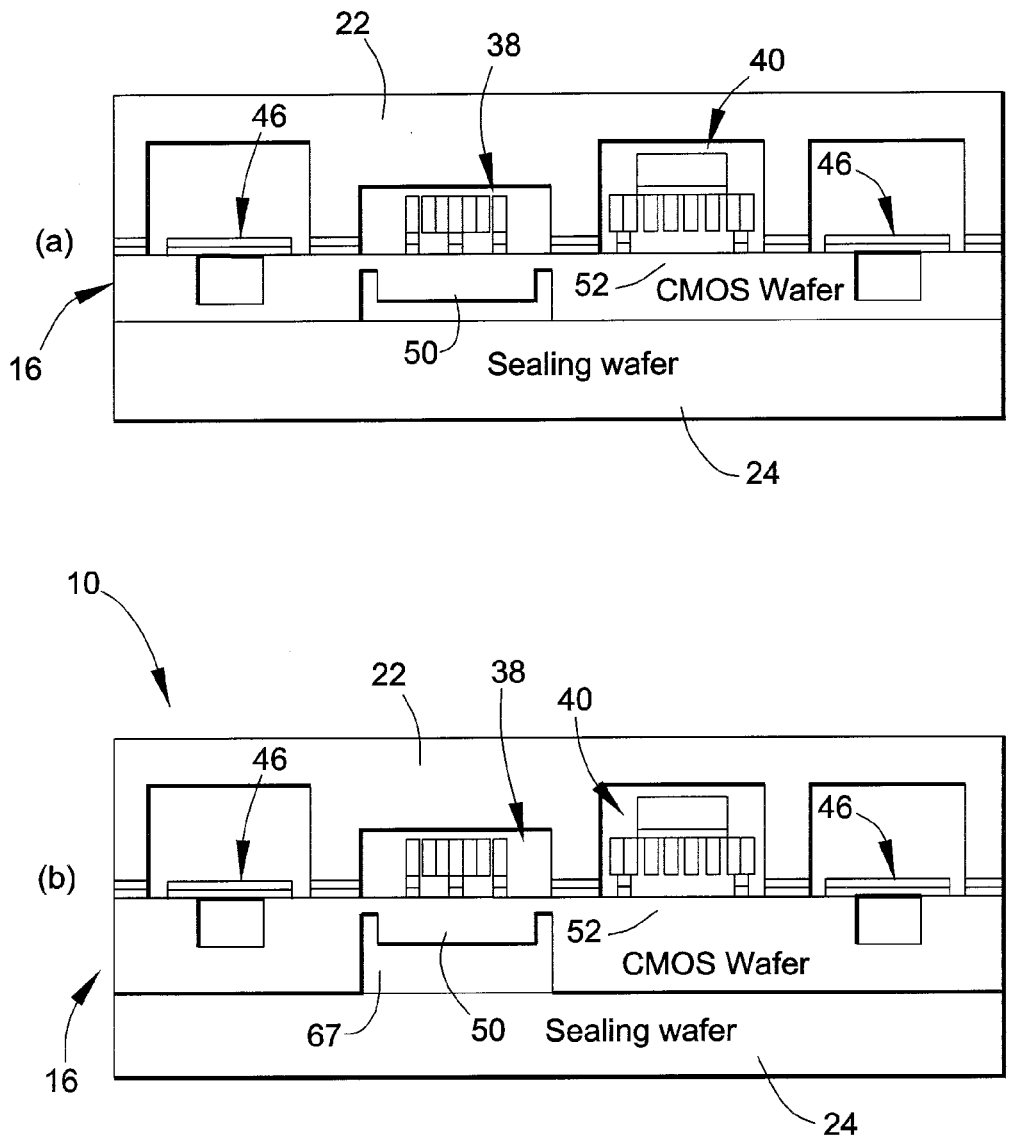
FIG. 4a-b schematically represents steps performed to yield a sensor chip through bonding a sealing wafer to the capped device-IC wafer assembly of FIG. 3d, followed by singulation.

FIGS. 1 through 4 represent various steps involved in the fabrication of individual sensor chips 10 (FIG. 4), which can be subsequently assembled to yield a multi-chip IMU 12 (FIG. 8) with the use of a mounting fixture 14 described in reference to FIGS. 6 through 11. While the invention will be discussed in particular reference to the fabrication of IMUs, it should apparent that processing steps represented in FIGS. 1 through 4 could be used in the fabrication of various types of MEMS chips, which may then be assembled to produce a variety of multi-chip packages. As such, the invention is not limited to any particular type of chip, package or end use.

As will be discussed in reference to FIGS. 1 through 4, a particular embodiment of the invention involves fabricating a sensor chip 10 as a single-axis device-IC die 16 (FIG. 2d) at the wafer level from a processed device wafer 18, a CMOS integrated circuit (IC) wafer 20, a cap wafer 22, and a sealing wafer 24, all of which are preferably formed of silicon. These wafers 18, 20, 22 and 24 form a silicon wafer stack from which a large number of sensor chips 10 can be simultaneously fabricated. FIGS. 6 through 11 will then be discussed in reference to producing an IMU 12 having a three-axis sensing capability by assembling three sensor chips 10 of the type fabricated using the process steps represented in FIGS. 1 through 4. As will be discussed below, the sensor chips 10 are preferably interconnected with a flexible interconnect prior to being configured with the mounting fixture 14 to form the IMU 12, and the mounting fixture 14 configures the IMU 12 through a fixturing process that includes folding the flexible interconnects so that the chips 10 are disposed in different planes.

FIG. 1a represents a silicon-on-insulator (SOI) wafer 26 used in the fabrication of the device wafer 18. The SOI wafer 26 comprises a device layer 28 separated from the remainder of the SOI wafer 26 by a buried oxide layer 30. All-silicon mechanical structures suitable for sensing devices (for example, gyroscopes and accelerometers) of the IMU 12 are fabricated in the device layer 28, which for this reason should have a suitable thickness for this purpose. As an example, the device layer 28 may have a thickness of about 100 to about 150 micrometers. In FIG. 1a, fabrication of the device wafer 18 includes defining bond stacks 32 on the surface of the device layer 28. Suitable materials for the bond stacks 32 include but are not limited to layers of chromium and gold (Cr/Au stacks), as generally known in the art. The bond stacks 32 can be formed by either lift-off or electroplating processes known in the art. FIG. 1b represents mechanical structures 34 and 36 defined in the device layer 28 that will form parts of a pair of sensing devices, represented in FIG. 2d as a gyroscope 38 and an accelerometer 40. The mechanical structures 34 and 36 can be fabricated using a deep reactive ion etching (DRIE) process. The buried oxide layer 30 under the device layer 28 serves as an etch stop for the etching process. Lateral shock protection (not shown) can also be defined with this etching step, for example, by fabricating shock stoppers that will be disposed around the ring of the gyroscope 38 and around fingers of the accelerometer 40.

As represented in FIG. 2a-d, the device wafer 18 is subsequently integrated with the CMOS IC wafer 20 by wafer bonding to yield the device-IC die 16. As noted above, in the embodiment in which three sensor chips 10 are used to produce the IMU 12, each integrated device-IC die 16 is fabricated to incorporate or be capable of incorporating a flexible flex interconnect for the purpose of electrically and physically interconnecting the three chips 10. As represented in FIG. 2a, a micro flex-cable can be fabricated as part of the CMOS wafer 20 after the completion of a standard CMOS process performed on the wafer 20 to define the desired electronic circuits 50 and 52 used to control and monitor the gyroscope 38 and accelerometer 40 and process their outputs.

In FIG. 2a, layers 42 and 44 of polyimide or other suitable flexible insulating material are shown as having been applied to a surface of the CMOS wafer 20 for the purpose of forming the outer insulation of a flex-cable 46. Polyimide PI-2611 possesses particularly suitable properties for this purpose, including flexibility (about 100% elongation), low stress (about 2 MPa), and low curing temperatures (typically less than 300° C.). The first polyimide layer 42 can be spin-coated and cured onto the CMOS wafer 20, followed by the deposition and patterning of conductor traces 48, for example, thin (about 2 micrometer) layers of aluminum. Various processes can be used to deposit and pattern the conductor traces 48, including lift-off or electroplating. The second polyimide layer 44 can then be deposited and cured to completely cover the patterned conductor traces 48. The polyimide layers 42 and 44 can then be patterned and etched, for example, by dry etching with the use of a metal mask (not shown), to complete the formation of the flex-cable 46.

As known in the art, temperature-sensitive gyroscopes and their IC circuits are often enclosed in a temperature-controlled vacuum cavity (for example, at a temperature of about 90° C.) to maintain their required stability. Thermal isolation of the mechanical structures 34 of the gyroscope 38 can be realized by suspending the portion of the CMOS wafer 20 containing the integrated circuit 50 of the gyroscope 38 with suspended beams 54 (FIG. 3d) defined in the CMOS wafer 20. The suspended beams 54 and flex-cables 46 can be defined by selectively etching the front-side of the CMOS wafer 20 (FIG. 2b). As a nonlimiting example, a high pressure RIE process can be used to undercut the flex-cables 46 on the surface of the CMOS wafer 20 and undercut surface regions of the CMOS wafer 20 that will form the beams 54 (FIG. 3d). Notably, the beams 54 also carry electrical leads to and from the integrated circuit 50. Minimizing the number of beams 54 by device-IC integration has the benefit of improving the thermal isolation of the integrated circuit 50. Similar to the device wafer 18, bonding stacks 56 are defined on the surface of the CMOS wafer 20, as seen in FIG. 2b. Bonding stacks 57 are also formed on the surface of the CMOS wafer 20 for subsequent bonding to the capping wafer 22 (FIG. 3c) The device wafer 18 resulting from the processing steps of FIG. 1a-d is then flipped and bonded to the CMOS wafer 20, as shown in FIG. 2c. As represented in FIG. 2d, a proof mass 58 for the accelerometer 40 can then be formed by etching the backside of the SOI wafer 26 of the device wafer 18, followed by RIE etching the buried oxide layer 30 of the SOI wafer 26 to dry release the mechanical structures 34 and 36 of the gyroscope 38 and accelerometer 40, yielding the device-IC wafer 16.

FIG. 3a-d represent the fabrication of the cap wafer 22 used to protect the mechanical structures 34 and 36 of the gyroscope 38 and accelerometer 40. Bonding stacks 60 (for example, Cr/Au) can first be patterned on the wafer 22 (FIG. 3a) for bonding to the bond stacks 57 of the CMOS wafer 20, followed by cavity etch steps to produce two cavities 62 and 64 in the cap wafer 22. In the example, the shallower cavity 62 is intended for the gyroscope 38 and the deeper cavity 64 is intended for the accelerometer (FIG. 3b). Deep trench DRIE etches are also performed to define trenches 66 that will subsequently allow singulation of the individual sensor chip 10 from the wafer stack. In FIG. 3c, the etched cap wafer 22 has been bonded to the device-IC wafer 16 to enclose the mechanical structures 34 and 36 of the gyroscope 38 and accelerometer 40. The cap wafer 22 can also provide vertical over-range shock stops for the gyroscope 28 and accelerometer 40. The backside of the CMOS wafer 20 is then preferably thinned, patterned and etched so that the portion of the CMOS wafer 20 containing the integrated circuit 50 is suspended and thermally isolated with the beams 54 (FIG. 3d).

FIG. 4a-b represent the processing steps in which the backside of the CMOS wafer 20 is sealed by bonding the sealing wafer 24 to the CMOS wafer 20. This sealing process can be accomplished using a high-vacuum high-yield metal eutectic bonding, for example, a transient liquid phase (TLP) technique using Si—Au, In—Au, etc., to yield a vacuum cavity 67 between the device-IC 16 wafer and the sealing wafer 24 to provide a high-Q resonance for the gyroscope 38 and high-thermal isolation for the assembly. As previously noted, the temperature within the vacuum cavity 67 can be controlled, for example, with appropriate heaters (not shown) integrated onto the CMOS wafer 20, to promote the stability of the gyroscope 38. After bonding the seal wafer 24, the backside of the sealing wafer 24 is preferably thinned to reduce its thickness. Final singulation can then be completed by either RIE etching or by wafer dicing through the trenches 66 to yield the sensor chip 10 represented in FIG. 4b.

Figure 5:
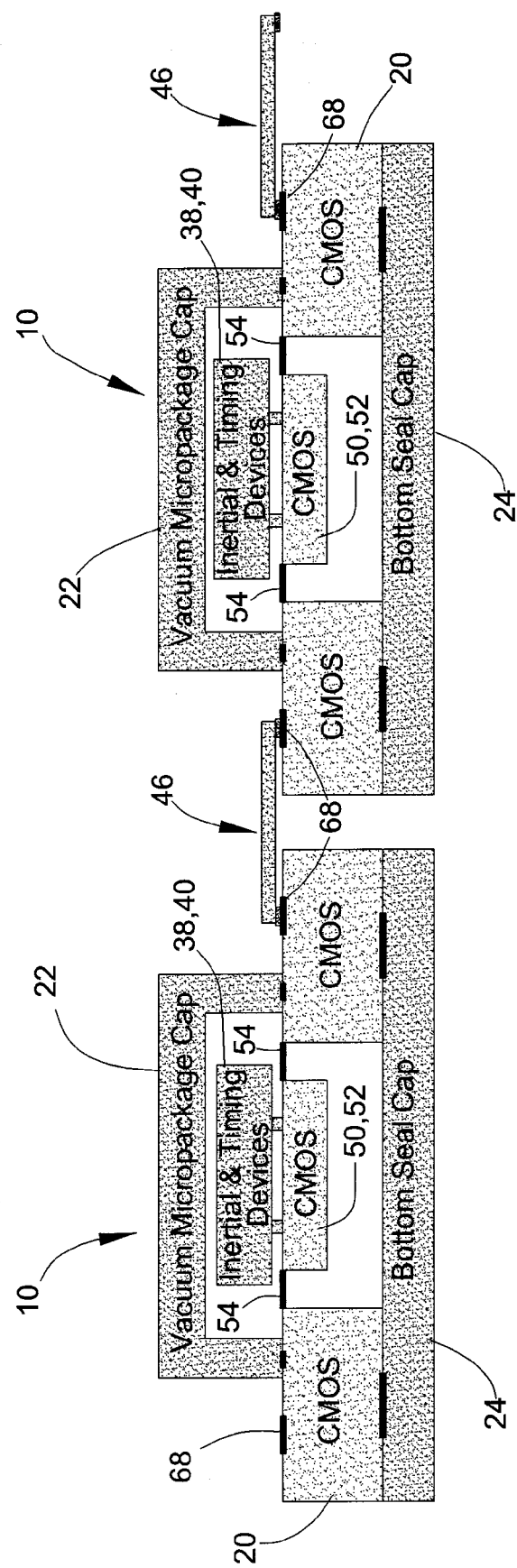
FIG. 5 schematically represents a cross-sectional view of two singulated single-axis sensor chips of types that can be produced by the processes represented in FIGS. 1 through 4, and shows the sensor chips as being electrically and physically interconnected with a flexible micro-cable.

As evident from FIG. 4b, each flex-cable 46 will extend beyond the periphery of its respective chip 10 following singulation. As previously discussed, the flex-cables 46 of the chips 10 serve to provide electrical interconnection between chips 10, as well as define the means by which individual chip 10 can be folded relative to adjacent chips 10 during the construction of the IMU 12. FIG. 5 represents a cross-sectional view of two singulated sensor chips 10 that share similar aspects to the chip 10 represented in FIG. 4b, including thermal isolation and vacuum encapsulation, and with the singulated chips 10 electrically interconnected with the flex-cables 46 integrated into the construction of the chips 10, which are shown as being connected to lead transfer pads 68 provided on the surfaces of the CMOS wafers 20 of the chips 10.

As previously noted, FIGS. 6 through 11 depict processing steps by which an IMU 12 having a three-axis sensing capability can be assembled using three singulated sensor chips 10 interconnected with flex-cables 46, as represented by the process steps in FIGS. 1 through 4. As will be discussed below, the mounting fixture 14 configures the IMU 12 through a fixturing process that includes folding the flex-cables 46 so that the chips 10 are disposed in different planes, preferably with their backsides (seal wafers 24) perpendicular each other. The process of assembling the IMU 12 is a batch assembly process, in which the three singulated chips 10 are picked and placed in mount cavities 70 of the mounting fixture 14, which results in the flex-cables 46 being folded to produce what may be termed a three-dimensional folded three-axis IMU 12.

Figure 6A:
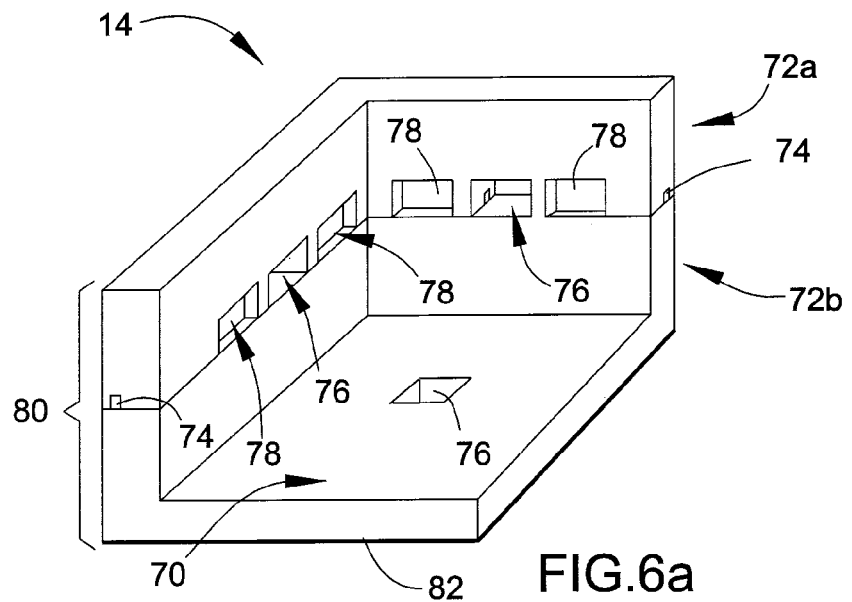
Figure 6B:
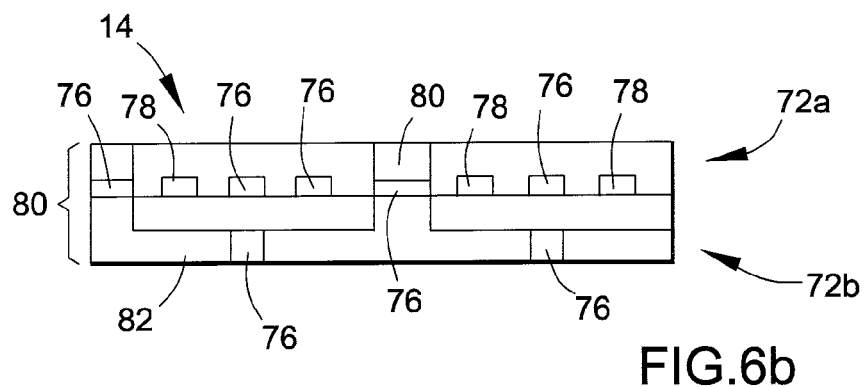

A portion of the mounting fixture 14 containing a single mount cavity 70 is represented in FIG. 6a. The mounting fixture 14 is preferably in the form of a wafer, and more preferably a silicon wafer stack formed by joining two (or more) wafers 72a and 72b. From FIGS. 6a and 6b, it can be appreciated that the wafers 72a and 72b in combination define multiple mount cavities 70 that define openings in one surface of the mounting fixture 14. In addition, the wafers 72a and 72b cooperate to define side walls 70 that define the openings and peripheral extents of the cavities 70, and bottom walls 82 that adjoin the side walls 80 of their corresponding cavities 70 and close the cavities 70 at the surface of the mounting fixture 14 opposite the openings defined by the cavities 70. As represented in FIGS. 6a and 6b, and according to a preferred aspect of the invention, adjoining side walls 80 are approximately perpendicular to each other, and each bottom wall 82 is orthogonal to its adjoining side walls 80.

The wafers 72a and 72b also cooperate to define vacuum channels 74 within the side walls 80, vacuum holes 76 in the side and bottom walls 80 and 82, and bonding sites 78 in the side walls 80. As evident from FIGS. 6a and 6b, the vacuum channels 74 are enclosed within the side walls 80, the vacuum holes 76 are through-holes that pass entirely through the side and bottom walls 80 and 82, and the bonding sites 78 are blind holes defined in the surfaces of the side walls 80. In combination, the channels 74, holes 76 and bonding sites 78 cooperate to assist in the alignment and assembly of the sensor chips 10 within the mount cavities 70. These features and the overall configuration of the mounting fixture 14 can be fabricated by wafer etching techniques. For example, the processing of the wafer 72a can include a thermal oxidation step to form an oxide layer that can be used as an etch mask for frontside and backside etching prior to bonding the wafer 72a to the second wafer 72b. For example, etching of the wafer 72a can be used to form what may be termed precursor structures for the vacuum channels 74, vacuum holes 76 and bonding sites 78 that will be present in the side walls 80. Following etching, the wafer 72a is flipped and bonded to the second wafer 72b, for example, by eutectic bonding, solder bonding, fusion bonding, etc. In so doing, the channels 74 are enclosed within the side walls 80. Deep RIE etch is then preferably performed to form the cavities 70, define the side walls 80 that separate the cavities 70 of the mounting fixture 14, expose the vacuum holes 76 in the side walls 80, and etch the vacuum holes 76 in the bottom wall 82 of the wafer 72b.

Figure 7:
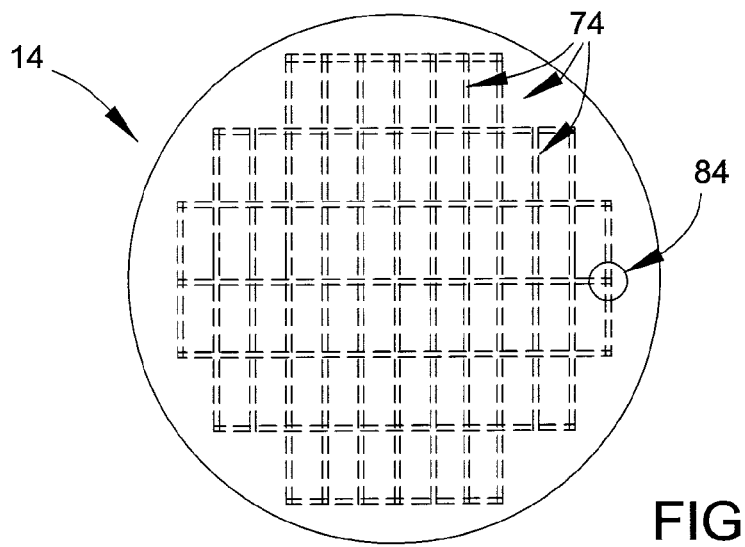
FIG. 7 schematically represents a backside view of a mounting fixture produced by the process of FIG. 6, and shows the locations of vacuum channels and a vacuum port for enabling the application of a vacuum to facilitate three-dimensional assembling and packaging of electromechanical devices within mount cavities on the opposite side of the mounting fixture.

The vacuum channels 74 are fluidically connected to the vacuum holes 76 in the side walls 80 of each cavity 70 to enable a vacuum to be applied to the vacuum holes 76 that is capable of securing the sensor chips 10 to the side walls 80. In the preferred embodiment, vacuum and/or pressure can be separately applied via any suitable means to the vacuum holes 76 defined in the bottom walls 82 of the mount wafer 14. The bonding sites 78 are etched in the side walls 80 to assist with the vacuum assembly and rigid attachment of the chips 10 to the side walls 80 of the mounting fixture 14. The vacuum is applied to the interconnected network of vacuum channels 74 through a port 84 defined in the surface of mounting fixture 14 opposite the cavities 70, and preferably near the edge of the mounting fixture 14 as represented in FIG. 7.

Figure 8:
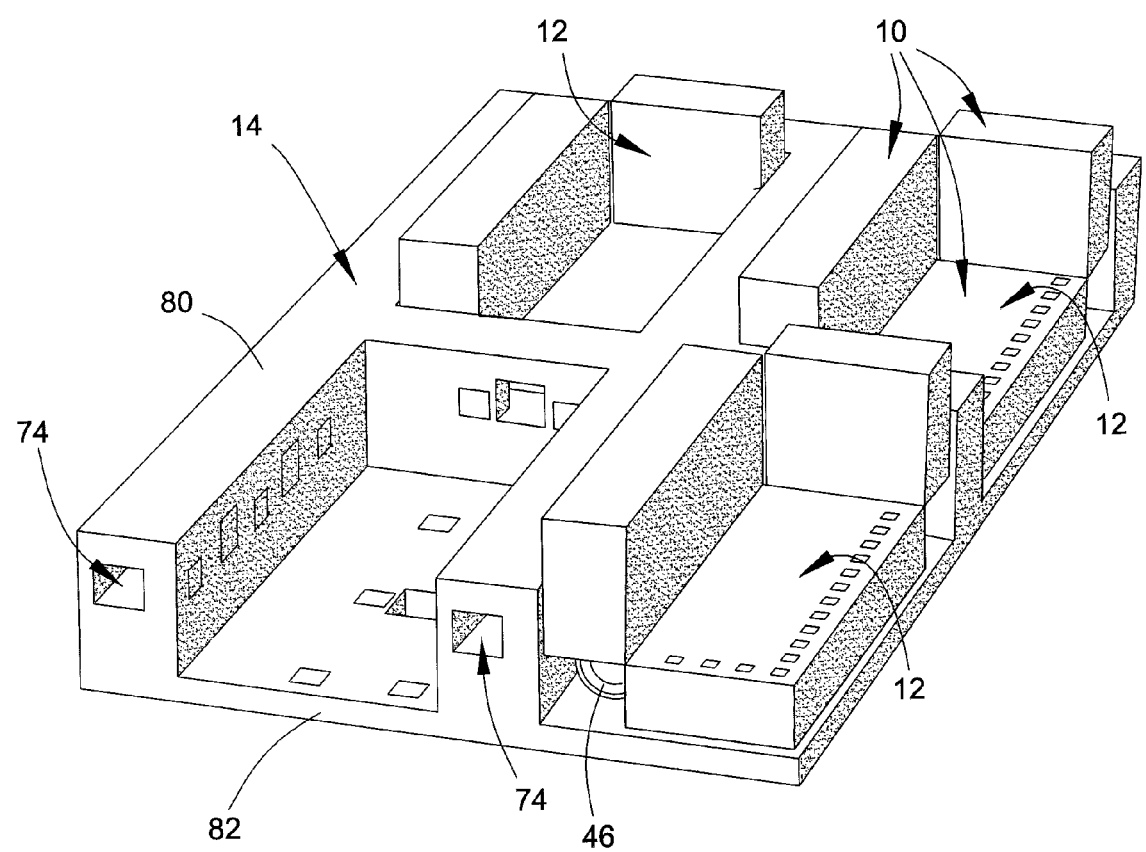
FIG. 8 schematically represents a perspective view of four mount cavities within a portion of the mounting fixture of FIG. 7, and represents each of three of the mount cavities containing three-axis IMU comprising multiple sensor chips that have been assembled in the mount cavities (FIG. 8a) for further processing so that each will yield a stand-alone three-axis IMU.

Three-dimensional chip assemblies can then be produced in batch-type processes performed with the mounting fixture 14. Three sensor chips 10, each a single-axis device (x, y or z axis) and all three chips 10 interconnected by flex-cables 46, are placed in each of the cavities 70 as represented in FIG. 8, with the result that their flex-cables 46 are bent to accommodate the different orientations of the chips 10 within each cavity 70. The orthogonal orientations of the side and bottom walls 80 and 82 of each cavity 70 determine the relative orientations of the chips 10 placed within the cavity 70, and more particularly ensure that the chips 10 will be orthogonally oriented relative to each other, which as used herein refers to the orientations of the surfaces of the chips 10 in which their respective mechanical structures 34 and 36 (and, therefore, their gyroscopes 38 and accelerometers 40) were fabricated. The relative orientations of the chips 10 can be used to determine the particular type or types of sensing elements that are desired for a given chip 10. For example, the z-axis sensor chip 10 (containing a z-axis gyroscope) may preferably include x-axis and y-axis accelerometers, and the x-axis or y-axis sensor chip 10 (containing an x-axis or y-axis gyroscope) may preferably include two orthogonal lateral accelerometers to obtain an accurate z-acceleration vector. Thus a rotational misalignment of a chip 10 around its out-of-plane axis can be canceled. The full circular symmetry of the chips 10 makes them robust against rotational misalignments.

Prior to placement of the chips 10 in the cavities 70, the backside (seal wafers 24) of each chip 10 is metallized, for example, with gold strips (not shown) or any other suitable bonding material. Once the chips 10 are placed in the cavities 70, a controlled sequence of pressure and vacuum can be applied through the vacuum channels 74 and vacuum holes 76 in combination with ambient air pressure. First, the x-axis and y-axis sensor chips 10 are drawn to the vertical sidewalls 80 of the cavities 70 in the mounting fixture 14 by vacuum applied through the side wall vacuum holes 76. During this process, air pressure can be supplied to the vacuum holes 76 in the bottom wall 82 of each cavity 70 for the purpose of reducing friction between the bottom wall 82 and the z-axis sensor chip 10. Alternatively or in addition, an anti-friction coating could be applied to the bottom wall 82 and/or the z-axis sensor chip 10. Once the x-axis and y-axis sensor chips 10 are properly positioned with each cavity 70, vacuum can be applied through the bottom wall vacuum holes 76 to secure the z-axis sensor chips 10.

With the three chips 10 now rigidly secured by vacuum to the cavity side walls 80 in the manner described above, a bonding force is applied and the chips 10 are heated to cause the metallization on the backsides of the chips 10 to flow and, upon solidification, form metallic (for example, Si—Au eutectic) bonds between the backsides of the chips 10 and the cavity sidewalls 80 of the mounting fixture 14. The side walls 80 are recessed to match the gold bonding strip sites on the chips 10 to ensure a uniform Si—Si stop between the side walls 80 and the backsides of the chips 10. As an alternative to Au—Si eutectic bonds, various other bonding schemes could be used and in such cases the gold strip would be replaced by an appropriate material and/or structure. As nonlimiting examples, a die bonding scheme including low-temperature metal eutectic, polymer bonding, ion-assisted could be used. The rigidly-mounted silicon chips 10 within the cavities 70 formed by the silicon wafers 72a and 72b helps to minimize misalignment fluctuation of the sensors 10.

Figure 9:
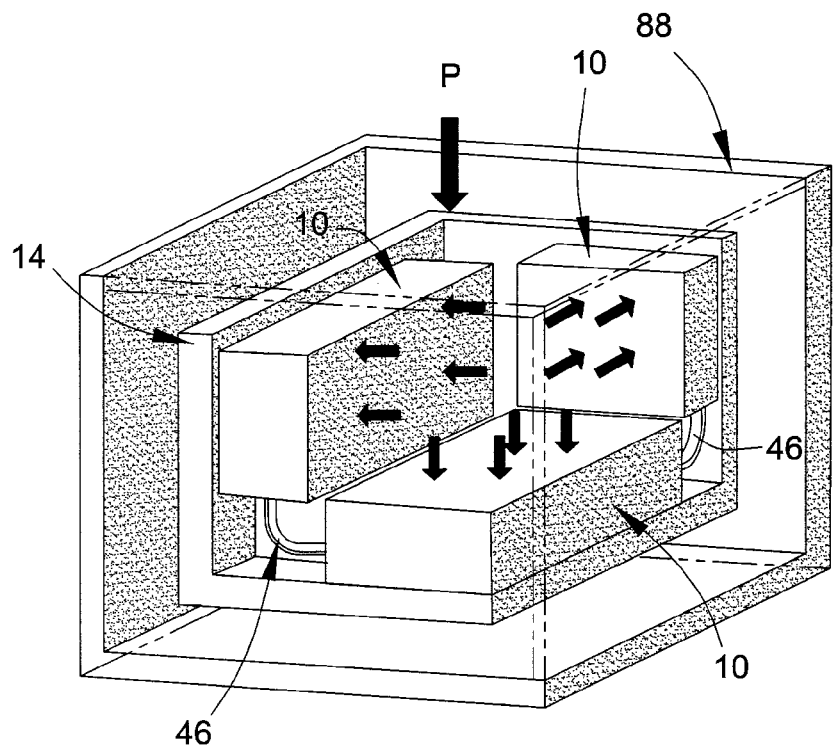
FIG. 9 schematically represents a perspective view of a single mount cavity of the mounting fixture of FIGS. 7 and 8 and a three-axis IMU within the mount cavity, and illustrates the application of a bonding pressure/force to the IMU as a result of placing the mounting fixture within a pressure chamber.

Different methods are possible for applying the bonding force to the chips 10 during the bonding step. One approach utilizes pressure applied with a gas by placing the mounting fixture 14 and its chips 10 in a pressure chamber 88, generally as represented in FIG. 9. A high pressure is directly pumped into the pressure chamber such that a bonding force is applied to each chip 10 during bonding that is normal to both the backside of each chip 10 and the cavity side walls 80 of the mounting fixture 14.

Figure 10:
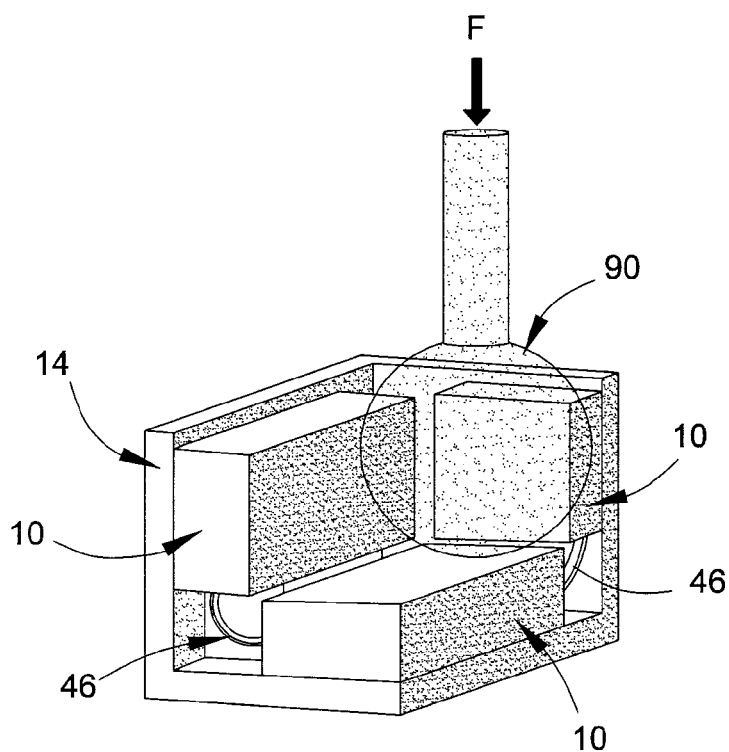
FIG. 10 schematically represents a perspective view of a single mount cavity of the mounting fixture of FIGS. 7 and 8 and a three-axis IMU within the mount cavity, and illustrates the application of a bonding pressure/force to the IMU as a result of using a pressurized balloon.

Another approach utilizes a flexible balloon 90 placed in the cavity 70 of the mounting fixture 14, as represented in FIG. 10. Increasing pressure within the balloon 90 causes the balloon 90 to expand in all three dimensions, with the result that the balloon 90 contacts each of the chips 10 and applies a bonding force that is normal to the backside of each chip 10. Mechanical springs, hydraulics, gears or other movable structures capable of applying a force in three orthogonal directions could be used to generate a bonding force/pressure similar to that achieved with the balloon 90.

Figure 11:
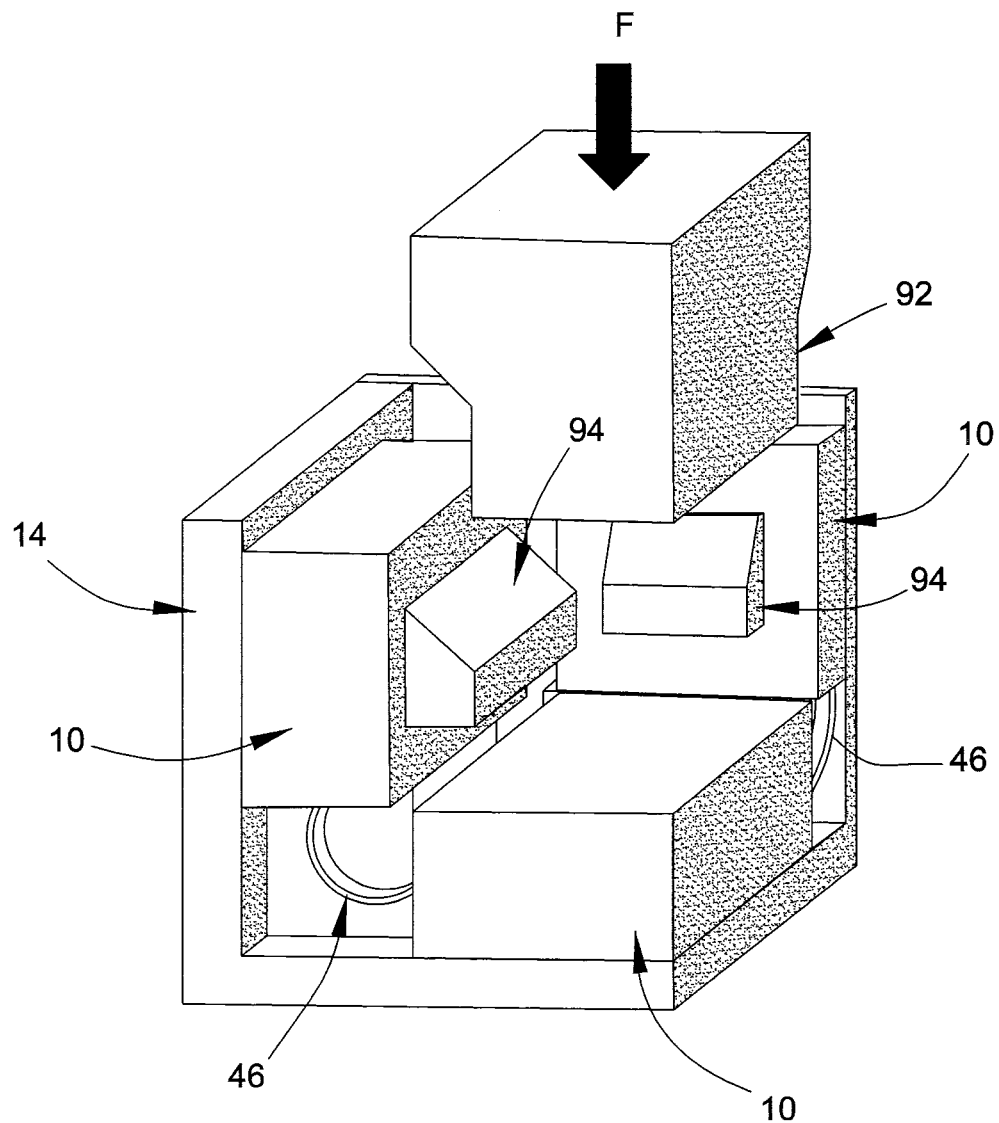
FIG. 11 schematically represents a perspective view of a single mount cavity of the mounting fixture of FIGS. 6, 7 and 8 and a three-axis IMU within the mount cavity, and illustrates the application of a bonding pressure/force to the IMU as a result of using a slant pressure head.

In yet another approach represented in FIG. 11, a pressure head 92 could be used in combination with slanting surfaces 94 fabricated on the backsides of the x-axis and y-axis chips 10. Downward pressure applied with the head 92 applies a downward force to the z-axis chip 10, while simultaneously causing the head 92 to engage the slant surfaces 94 of the x-axis and y-axis chips 10. Because of the orientations of the slant surfaces 94, the forces applied by the head 92 to the x-axis and y-axis chips 10 are decomposed into two force components, such that a normal force is applied to the backside of each chip 10 during bonding.

In view of the above, the invention provides processes for fabricating IMUs through a process that is also capable of defining thermally isolated device-IC dies and three-dimensional wafer-level assembling and packaging of the IMU. The fixturing of three sensors during bonding helps to promote the performance, accuracy and stability of the resulting IMU, as well promote the manufacturing capability and minimizing power consumption of the IMU.

While the invention has been described in terms of specific embodiments, it is apparent that other forms could be adopted by one skilled in the art. For example, the physical configuration of the sensors 10, mounting fixture 14 and resulting three-axis IMU 12 could differ from those shown, the processes could be used to produce other types of three-dimensional MEMS sensors, and materials and processes other than those noted could be used. Therefore, the scope of the invention is to be limited only by the following claims.

The invention claimed is:

1. A process of assembling a three-dimensional electromechanical device, the process comprising:
    providing a mounting fixture comprising at least one wafer member defining oppositely-disposed first and second surfaces, and at least a first mounting cavity in the wafer member, the first mounting cavity defining an opening in the first surface of the wafer member and being defined by multiple side walls and a bottom wall that adjoins the side walls and closes the first mounting cavity at the second surface of the wafer member;
    placing multiple chips in the first mounting cavity through the opening of the cavity in the first surface of the wafer member, a first of the chips contacting a first of the side walls, a second of the chips contacting a second of the side walls, and a third of the chips contacting the bottom walls;
    securing the first and second chips to the first and second side walls; and
    joining the first, second and third chips to form the three-dimensional electromechanical device.

2. The process according to claim 1, wherein the first, second and third chips are electrically and physically interconnected with flexible cables prior to being placed in the first mounting cavity, and the flexible cables are folded as a result of placing the chips in the first mounting cavity.

3. The process according to claim 1, wherein the first, second and third chips are joined by flowing and solidifying a metallic bond material.

4. The process according to claim 1, wherein the electromechanical device is a three-axis inertial measurement unit and each of the chips comprises a gyroscope and/or an accelerometer.

5. The three-dimensional device assembled by the process of claim 1.

6. The three-dimensional device according to claim 5, wherein the device is a three-axis inertial measurement unit.

7. A process of assembling a three-dimensional electromechanical device, the process comprising:
    fabricating a mounting fixture by etching at least one wafer member having oppositely-disposed first and second surfaces to define at least a first mounting cavity that defines an opening in the first surface of the wafer member, multiple side walls and a bottom wall that adjoins the side walls and closes the first mounting cavity at the second surface of the wafer member;
    placing multiple chips in the first mounting cavity through the opening of the cavity in the first surface of the wafer member, a first of the chips contacting a first of the side walls, a second of the chips contacting a second of the side walls, and a third of the chips contacting the bottom walls;
    securing the first and second chips to the first and second side walls; and
    joining the first, second and third chips to form the three-dimensional electromechanical device.

8. The process according to claim 7, further comprising applying a force to each of the first, second and third chips to promote bonding thereof during the joining step.

9. The process according to claim 8, wherein the force is applied with a pressurized gas.

10. The process according to claim 8, wherein the force is applied with a movable structure that applies the force in three orthogonal directions.

11. The process according to claim 7, wherein the first, second and third chips are electrically and physically interconnected with flexible cables prior to being placed in the first mounting cavity, and the flexible cables are folded as a result of placing the chips in the first mounting cavity.

12. The process according to claim 7, wherein the electromechanical device is a three-axis inertial measurement unit and each of the chips comprises a gyroscope and/or an accelerometer.

13. The three-dimensional device assembled by the process of claim 7.

14. The three-dimensional device according to claim 13, wherein the device is a three-axis inertial measurement unit.

15. A three-dimensional electromechanical device comprising:
    a mounting fixture comprising multiple side walls and a bottom wall that adjoins the side walls, and at least a first mounting cavity defined by at least first and second side walls of the multiple side walls and the bottom wall; and
    first, second and third chips that are within the first mounting cavity, bonded to the first ands second side walls and the bottom wall, respectively, of the mounting fixture, and oriented by the first ands second side walls and the bottom wall to be orthogonal to each other.

16. The three-dimensional electromechanical device according to claim 15, wherein the first, second and third chips are electrically and physically interconnected with flexible cables that are folded between adjacent pairs of the chips.

17. The three-dimensional electromechanical device according to claim 15, wherein the electromechanical device is a three-axis inertial measurement unit and each of the chips comprises a gyroscope and/or an accelerometer.

18. An inertial navigation system containing the three-axis inertial measurement unit of claim 15.

19. The inertial navigation system according to claim 18, wherein the inertial navigation system is installed in a moving object.

20. The process according to claim 1, wherein the mounting fixture is further provided to comprise:
    at least one channel within each of the first and second side walls of the first mounting cavity;
    at least one hole in each of the first and second side walls of the first mounting cavity and fluidically coupling the first mounting cavity to a corresponding one of the channels; and
    at least one hole in the bottom wall of the first mounting cavity;
    wherein the securing step comprises applying a vacuum to the channels within the first and second side walls so as to draw a vacuum at the holes in the first and second side walls to secure the first and second chips to the first and second side walls.

21. The process according to claim 7, wherein the mounting fixture is further fabricated to comprise:
channels within the first and second side walls;
holes in the first and second side walls that are fluidically coupled to the channels; and
holes in the bottom walls;
wherein the securing step comprises applying a vacuum to the channels within the first and second side walls so as to draw a vacuum at the holes in the first and second side walls to secure the first and second chips to the first and second side walls.

22. The three-dimensional electromechanical device according to claim 15, wherein the mounting fixture further comprises:
at least one channel within each of the first and second side walls of the first mounting cavity;
at least one hole in each of the first and second side walls of the first mounting cavity and fluidically coupling the first mounting cavity to a corresponding one of the channels; and
at least one hole in the bottom wall of the first mounting cavity;
wherein the holes and the channel are configured for drawing a vacuum at the holes in the first and second side walls to secure the first and second chips to the first and second side walls.

* * * * *